(12) United States Patent
Narumi

(10) Patent No.: US 8,922,401 B1
(45) Date of Patent: Dec. 30, 2014

(54) METHODS AND APPARATUS FOR INTERFERENCE CANCELING DATA CONVERSION

(71) Applicant: Raytheon Company, Waltham, MA (US)

(72) Inventor: Robert Narumi, Yorba Linda, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/035,982

(22) Filed: Sep. 25, 2013

(51) Int. Cl.
*H03M 1/00* (2006.01)
*H03M 1/18* (2006.01)
*H03M 1/08* (2006.01)
*H03M 1/12* (2006.01)

(52) U.S. Cl.
CPC *H03M 1/18* (2013.01); *H03M 1/08* (2013.01); *H03M 1/00* (2013.01); *H03M 1/12* (2013.01)
USPC .......................................... 341/110; 341/155

(58) Field of Classification Search
CPC ....... H03M 1/00; H03M 1/12; H04L 27/2657
USPC ................. 341/110, 155, 156, 118, 120, 121; 375/344
See application file for complete search history.

(56) References Cited

U.S. PATENT DOCUMENTS

| | | | |
|---|---|---|---|
| 5,047,772 A | 9/1991 | Ribner | |
| 5,266,952 A | 11/1993 | Stone et al. | |
| 6,219,390 B1 | 4/2001 | Prasanna | |
| 6,535,554 B1 | 3/2003 | Webster et al. | |
| 7,068,743 B1 | 6/2006 | Suzuki | |

(Continued)

FOREIGN PATENT DOCUMENTS

| | | |
|---|---|---|
| EP | 0 727 878 A2 | 8/1996 |
| EP | 2 280 492 A1 | 2/2001 |
| EP | 1 063 778 | 1/2005 |
| EP | 1 011 205 | 8/2009 |
| EP | 2 472 734 | 7/2012 |

OTHER PUBLICATIONS

U.S. Appl. No. 13/934,254, filed Jul. 3, 2013, 161 pages, downloaded on Sep. 3, 2013.

(Continued)

*Primary Examiner* — Joseph Lauture
(74) *Attorney, Agent, or Firm* — Daly, Crowley, Mofford & Durkee, LLP

(57) ABSTRACT

Methods and apparatus for interference cancelling data conversion. In one embodiment, an input includes an interfering signal and a signal of interest. In one embodiment, a system extends the received signal dynamic range of an analog-to-digital conversion system by partially cancelling an interfering signal with multiple analog-to-digital converters, a digital-to-analog converter, a programmable delay block, a gain block, and a difference amplifier, inverse non-linear blocks, and digital signal processing to reconstruct the received signal in the digital domain.

19 Claims, 14 Drawing Sheets

(56) References Cited

U.S. PATENT DOCUMENTS

| | | |
|---|---|---|
| 2003/0098806 A1 | 5/2003 | Green |
| 2009/0067555 A1* | 3/2009 | Hosoya et al. .............. 375/344 |
| 2010/0046660 A1 | 2/2010 | Sikri et al. |
| 2011/0305303 A1 | 12/2011 | Sikri et al. |
| 2012/0093269 A1 | 4/2012 | Yu et al. |
| 2012/0155411 A1 | 6/2012 | Ancora et al. |
| 2012/0250806 A1 | 10/2012 | Zhang et al. |
| 2012/0287968 A1 | 11/2012 | Gainey et al. |

OTHER PUBLICATIONS

Notification of Transmittal of the International Search Report and the Written Opinion of the International Searching Authority, or the Declaration, PCT/US2014/040642, date of mailing Oct. 21, 2014, 5 pages.

Written Opinion of the International Searching Authority, PCT/US2014/040642, date of mailing Oct. 21, 2014, 9 pages.

Hamid Reza Mafi et al.,: "A 10-Bit 50-Ms/s Charge Injection Pipelined Adc Using a Digital Calibration", 2012 $9^{th}$ International Multi-Conference on Systems, Signals and Devices (SSD 2012): Chemnitz, Germany, Mar. 20-23, 2012, IEEE, Piscataway, NJ, Mar. 20, 2012, pp. 1-6, XP032180303, DOI: 10.1109/SSD.2012.6198078. ISBN: 978-1-4673-1590-6.

* cited by examiner

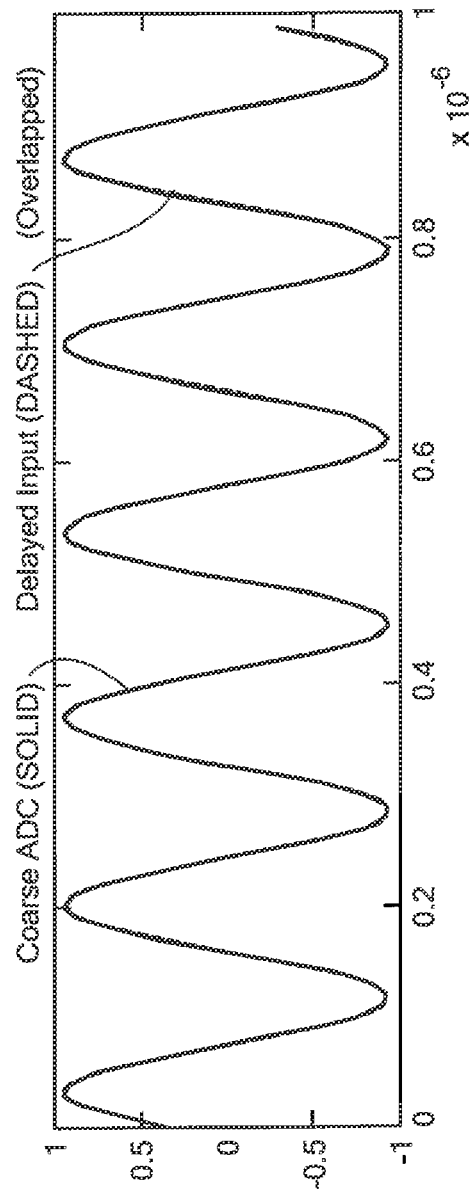
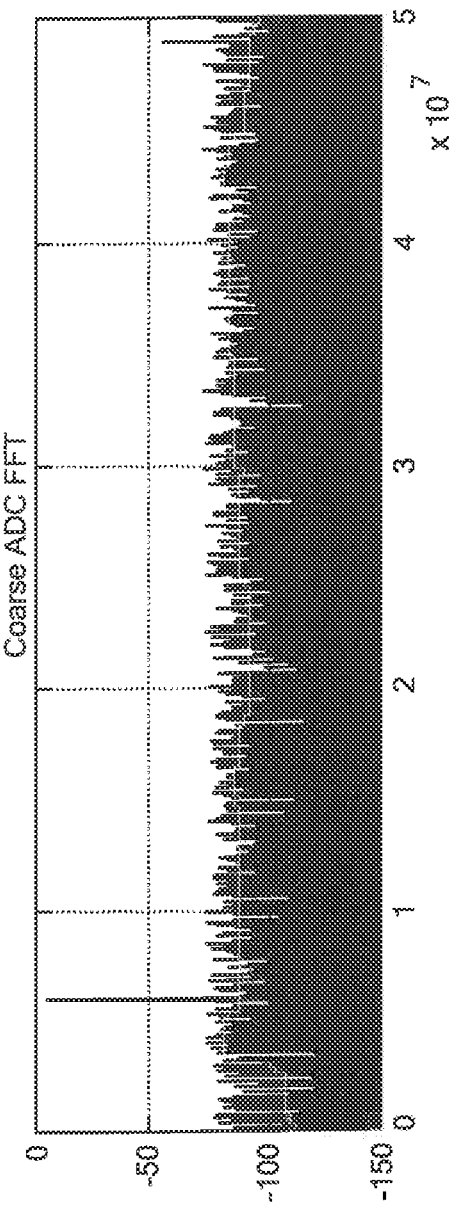
FIG. 5A
FIG. 5B

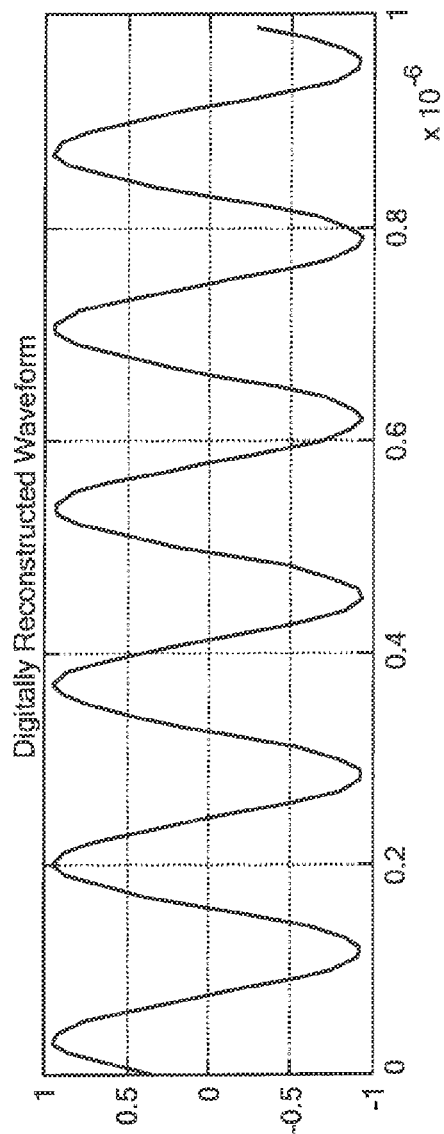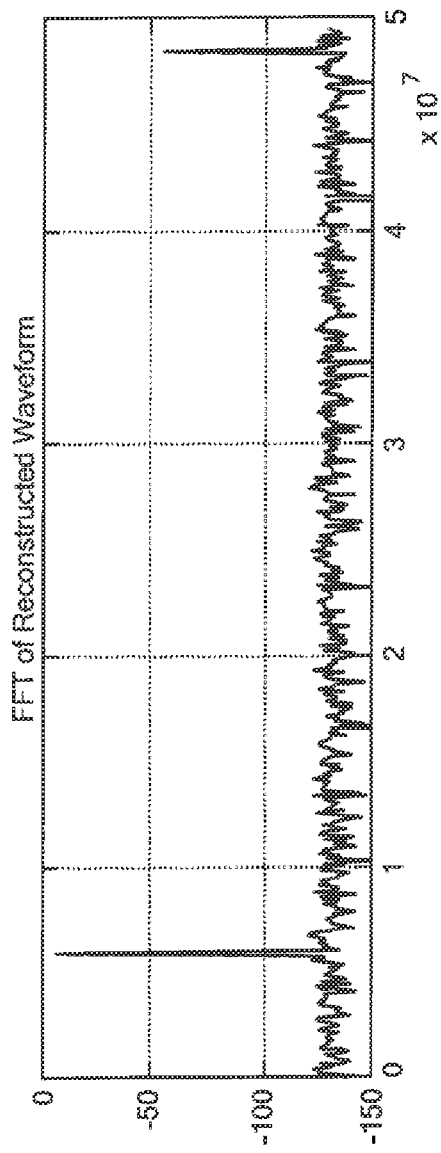
FIG. 5E
FIG. 5F

Single Tone

Input Parameters

| | | |
|---|---|---|
| Va | 1 | Volts Peak |
| Vb | 0 | Volts Peak |
| | | |
| Ao | 1 | |
| Bo | 0.001 | |
| Co | 0.0004 | |
| | | |
| f1 | 100 | MHz |
| f2 | 120 | MHz |

| | Frequency | Output | 1st Order Term | 2nd Order Term | 3rd Order Term |
|---|---|---|---|---|---|
| DC | 0 MHz | -56.0205999 dBm | | -56.02 dBm | |
| f2-f1 | 20 MHz | | | | |
| 2f1-f2 | 80 MHz | | | | -80.46 dBm |
| f1 | 100 MHz | 10.0000004 dBm | 10.00 dBm | | |
| f2 | 120 MHz | | | | |
| 2f2-f1 | 140 MHz | | | | |
| 2f1 | 200 MHz | -56.0205999 dBm | | -56.02 dBm | |
| f1+f2 | 220 MHz | | | | |
| 2f2 | 240 MHz | | | | |
| 3f1 | 300 MHz | -70.0000000 dBm | | | -70.00 dBm |
| 2f1+f2 | 320 MHz | | | | |
| 2f2+f1 | 340 MHz | | | | |
| 3f2 | 360 MHz | | | | |

*FIG. 6A*

Two-Tone

Input Parameters

| Va | 1 | Volts Peak |
| --- | --- | --- |
| Vb | 1 | Volts Peak |
| Ao | 1 | |
| Bo | 0.001 | |
| Co | 0.0004 | |
| f1 | 100 | MHz |
| f2 | 120 | MHz |

| Frequency | | Output | 1st Order Term | 2nd Order Term | 3rd Order Term |
| --- | --- | --- | --- | --- | --- |
| DC | 0 MHz | -50.0000000 dBm | | -50.00 dBm | |
| f2-f1 | 20 MHz | -50.0000000 dBm | | -50.00 dBm | |
| 2f1-f2 | 80 MHz | -60.4575749 dBm | | | -60.46 dBm |
| f1 | 100 MHz | 10.0000035 dBm | 10.00 dBm | | -50.92 dBm |
| f2 | 120 MHz | 10.0000035 dBm | 10.00 dBm | | -50.92 dBm |
| 2f2-f1 | 140 MHz | -60.4575749 dBm | | | -60.46 dBm |
| 2f1 | 200 MHz | -56.0205999 dBm | | -56.02 dBm | |
| f1+f2 | 220 MHz | -50.0000000 dBm | | -50.00 dBm | |
| 2f2 | 240 MHz | -56.0205999 dBm | | -56.02 dBm | |
| 3f1 | 300 MHz | -70.0000000 dBm | | | -70.00 dBm |
| 2f1+f2 | 320 MHz | -60.4575749 dBm | | | -60.46 dBm |
| 2f2+f1 | 340 MHz | -60.4575749 dBm | | | -60.46 dBm |
| 3f2 | 360 MHz | -70.0000000 dBm | | | -70.00 dBm |

METHODS AND APPARATUS FOR INTERFERENCE CANCELING DATA CONVERSION

BACKGROUND

As is known in the art, the reception and demodulation of desired analog and digital communication signals can be limited by the presence of high levels of unintentional and sometimes, intentional interference. Modern receivers convert analog input waveforms into digital waveforms at some point of the signal processing chain to take advantage of enhanced digital processing technologies. This conversion process of digitizing the analog waveform is performed by an analog to digital converter (ADC). As is known in the art, the level of in-band interference that can be tolerated in these digital receivers is often limited by the actual or effective number of bits (ENoB) of this ADC.

A number of attempts have been made to address ADC dynamic range limitations. Predictor circuits have been developed to estimate the next analog input value, cancel the predicted value in the analog domain, and recombine the estimate and subtracted waveform in the digital domain. In other systems, known transmissions are subtracted from the receive path. Other attempts to extend a system dynamic range include developing narrower band receivers to mask interfering signals and higher dynamic range ADCs to digitize both strong interfering and weak desired signals with sufficient signal-to-noise ratio.

SUMMARY

The present invention provides methods and apparatus for achieving interference cancelling data conversion. Exemplary embodiments of the invention extend the received signal dynamic range of an analog-to-digital conversion system by partially cancelling an interfering signal or signals with the use of multiple analog-to-digital converters, a digital-to-analog converter, a programmable delay block, a gain block, and a difference amplifier, and digital signal processing to reconstruct the received signal in the digital domain. The system can further include simultaneous or offline calibration to model system noise, distortion, and non-linear group delay to accurately reconstruct two passes of the signal through analog blocks.

In exemplary embodiments, a time-delayed version of the input signal is subtracted from the input signal as part of the cancellation scheme. Cancellation of interferers across the Nyquist bandwidth is achieved in a second pass path without growth in amplified residual when a small time mismatch is introduced in the cancellation process. Intermodulation distortion interference is removed in the digital domain by applying inverse distortion models for multiple signals in the analog signal paths.

In exemplary embodiments of the invention, interference cancellation as part of the cancellation scheme is achieved without reliance on prediction or known transmitted waveforms. In addition, exemplary embodiments of the invention can handle changing signal interference conditions.

In one aspect of the invention, a system comprises: a first ADC to receive an input signal comprising an interfering signal and a signal of interest, a DAC to receive an output from the first ADC and generate a coarse interferer cancelling signal, a first time delay module to delay in time the input signal, a first summer to subtract an output of the DAC from the delayed input signal output from the first time delay module, an amplifier coupled to the output of the first summer for outputting a residual signal, a second ADC to receive the residual signal from the amplifier, a second time delay module coupled to an output of the first ADC, a first pass distortion module coupled to the output of the second time delay module, a second pass distortion module coupled to the output of the second ADC, a second summer module to receive an output of the first pass distortion module and an output of the second pass distortion module and output a reconstructed signal of interest.

The system can further include one or more of the following features: a gain module between the second ADC and the second pass distortion module, the first and second pass distortion models provide non-linear harmonic distortion calibration, the system does not use a predicted waveform, the system does not subtract a known waveform to perform interference cancellation, a time mismatch between the first and second time delay modules does not result in growth in the amplified residual signal, the first pass distortion module is configured to apply an inverse non-linear distortion module to remove distortion products on data received by the first ADC, the first pass distortion module is configured to apply an inverse polynomial based on a model of the first ADC, and/or the second pass distortion module is configured to apply an inverse non-linear distortion function for the second ADC and a DGC.

In another aspect of the invention, a method comprises: receiving an input signal comprising an interfering signal and a signal of interest, digitizing the input signal to generate a digitized input signal and a coarse interferer cancelling signal, employing a first time delay module to delay in time the input signal, subtracting the coarse interferer cancelling signal from the delayed input signal to generate a residual signal, amplifying the residual signal, digitizing the amplified residual signal, delaying the digitized input signal, employing a first pass distortion module to remove distortion from the delayed digitized input signal, employing a second pass distortion module to remove distortion from the digitized amplified residual signal, summing in a summer the outputs of the first and second pass distortion modules, and reconstructing the signal of interest from the summer output.

The method can further include one or more of the following features: employing a gain module between the second ADC and the second pass distortion module, the first and second pass distortion models provide non-linear harmonic distortion calibration, a predicted waveform is not used, a known waveform is not subtracted to perform interference cancellation, and/or a time mismatch between the first and second time delay modules does not result in growth in the amplified residual signal.

In a further aspect of the invention, a system, comprises: a first ADC means for receiving an input signal comprising an interfering signal and a signal of interest, a DAC means for receiving an output from the first ADC and generating a coarse interferer cancelling signal, a first time delay means delaying in time the input signal, a first summer means for subtracting an output of the DAC from the delayed input signal output from the first time delay means, an amplifier coupled to the output of the first summer means for outputting a residual signal, a second ADC means receiving the residual signal from the amplifier, a second time delay means coupled to an output of the first ADC means, a first pass distortion means coupled to the output of the second time delay module, a second pass distortion means coupled to the output of the second ADC means, a second summer means for receiving an output of the first pass distortion module and an output of the second pass distortion means and output a reconstructed signal of interest.

BRIEF DESCRIPTION OF THE DRAWINGS

The foregoing features of this invention, as well as the invention itself, may be more fully understood from the following description of the drawings in which:

FIGS. 5A-F shows the signals of FIGS. 4A-F with a small time mismatch;

FIGS. 6A and 6B are tabular representations of single and two tone outputs for the model of FIG. 6;

DETAILED DESCRIPTION

Figure 1:
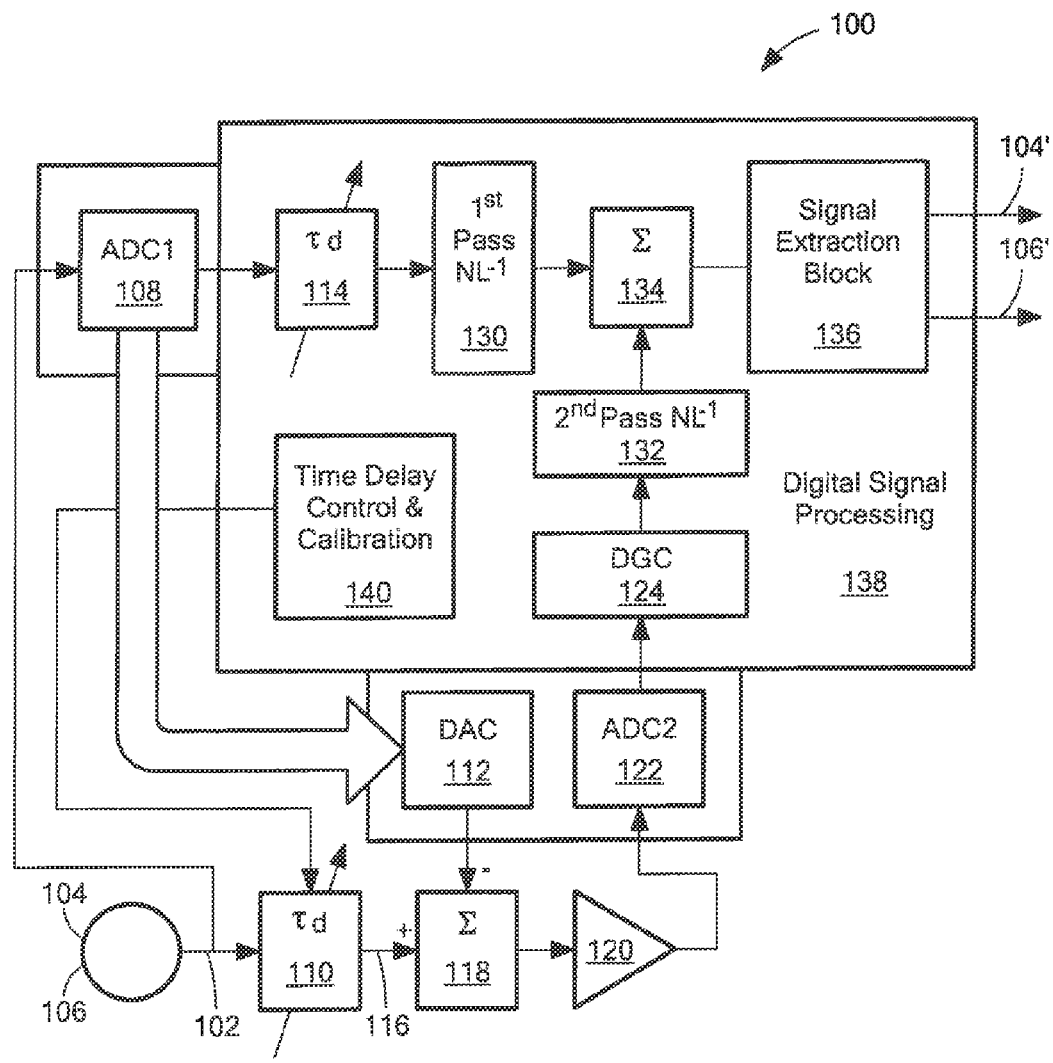
FIG. 1 shows an exemplary interference cancellation system

FIG. 1 shows a signal interference cancellation system 100 in accordance with exemplary embodiments of the invention. The system includes an input signal 102 including an interfering signal 104 combined with a signal of interest 106. The input signal 102 is provided to a first ADC 108 and to a first time delay module 110. The first ADC 108 output is provided to a DAC 112 and to a second time delay module 114. A first summer module 118 subtracts the output of the DAC 112 from the time delayed input signal 116. The first summer 118 output is amplified 120 to provide a residual signal to a second ADC 122.

A first pass non-linear processing block 130 receives the time delayed output of the first ADC 108 and a second pass non-linear processing block 132 receives the output from the second ADC 122 after digital gain control 124. The outputs of the first pass non-linear processing block 130 and the second pass non-linear processing block 132 are combined in a third summer module 134. The third summer output 134 is provided to a signal extraction block 136 that can output reconstructed versions of the interfering signal 104' and the signal of interest 106' from the input signal 102.

In the first pass, the input signal 102 is digitized with the first ADC 108 quantizing the signal into 2^n bits of digital data. It is sometimes considered a coarse pass but an accurate estimate of the signal. The first ADC 108 output is then delayed 114 in time and the reconstructed DAC 112 output is used to subtract out the relatively strong interfering signal 104 to the quantization accuracy of the ADC 108 output using the first summer 118, which outputs the residual signal. The time delay accounts for latency of the "coarse" ADC 108. The reconstruction DAC 112 converts the ADC 108 output to an analog signal and controls the amount of cancellation for the second pass of the system by subtracting the interference levels quantized and reconstructed by the ADC 108 and reconstruction DAC 112 from the input signal 102. In one particular embodiment, the first ADC 108 has an 8-bit output, the reconstruction DAC 112 has an 8-bit input, and the second ADC 122 has a 12-bit output.

In an exemplary embodiment, the outputs of first ADC 108, which provides the digitized input signal, and the second ADC 122, which provides the digitized residual signal, are processed in a digital signal processing module 138. A summing block 134 reconstructs the original input signal 102 by summing and aligning the timing of the outputs of the first and second ADCs 108, 122 accounting for the gain and time delay of each block. A time delay control and calibration module 140 controls the delay of the first time delay module 110 and the overall time alignment of the system. Signals of interest are extracted from the output of the summer 134 by the signal extraction block 136.

The first pass inverse non-linear block 130 applies an inverse non-linear distortion function to remove distortion products on the data received by the first ADC 108. In one embodiment, the inverse non-linear distortion is performed by (1) determining the strong signals and its fundamental distortion products, (2) determining the distortion function, (3) generating a distorted waveform based on the distortion function, and (4) removing/subtracting the undesired distortion products. In another embodiment, the inverse non-linear distortion is applied by an inverse polynomial equation based on a model of the first ADC 108 and the distortion products observed. Similarly, the second pass non-linear block 132 applies an inverse non-linear distortion function on the analog signal fed through the second ADC 122 and DGC 124. The Digital Gain Control (DGC) block 124 is nominally set to normalize the most significant bit of the second ADC 122 to one-half the level of the least significant bit of the first ADC 108.

Analog signals being digitized by the first ADC 108 may vary over time and may require automatic gain control (AGC) stages to control the level to the first ADC 108 input 102 so that they do not saturate or overdrive the first ADC 108 input. The normal operating signal level into the first ADC 108 input 102 is set to account for the largest or continuous or intermittent strong interfering signals.

The digital output signals from first pass non-linear block 130 and the second pass non-linear block 132 are digitally summed together in the summing block 134. The digital signals from these two paths are time-aligned by delay block 114 to account for the time delay path through the first ADC 108, DAC 112, analog summer 110, analog gain block 120, second ADC 122, and DGC 124.

The signal extraction block 136 separates signals of interest by applying digital filtering to select a desired signal and to attenuate or remove extraneous signals. By applying a Fast Fourier Transform (FFT) on the input data to the Signal Extraction Block 136, strong interfering signals can be identified and extracted as an output 104. Similarly, the desired signal can be extracted and output 106. As required, updates can be made to the inverse non-linear distortion applied by the first and second non-linear blocks 130, 132 to improve dynamic range of the system.

In exemplary embodiments of the invention, a system simultaneously calibrates out distortion and/or non-linear group delay in the reconstructed signal with the use of frequency swept calibration tone or tones with the use of a digital arbitrary waveform generator (AWG), another DAC, and a sum module. The system can also store and replay data through the system to improve the accuracy of the analog block models.

Figure 2B:
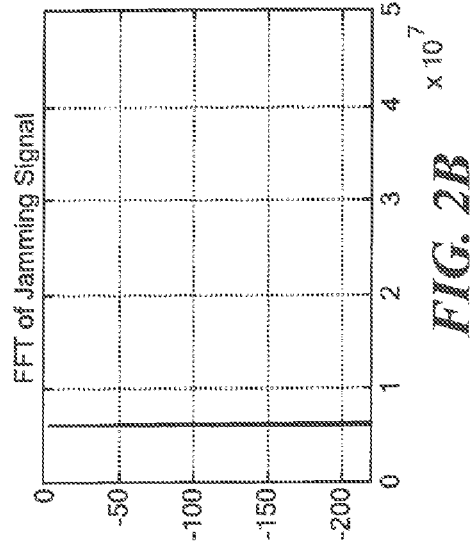
FIG. 2B shows a FFT of the jamming signal.
Figure 2D:
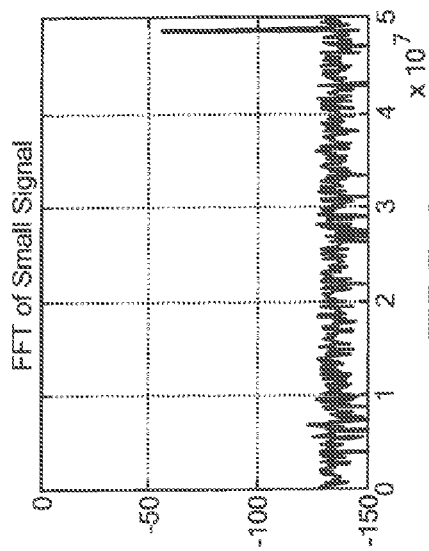
FIG. 2D shows a FFT of the signal of interest.
Figure 2A:
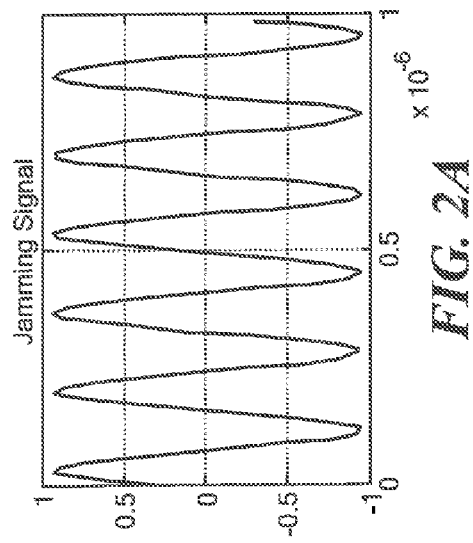
FIG. 2A shows a jamming signal.
Figure 2C:
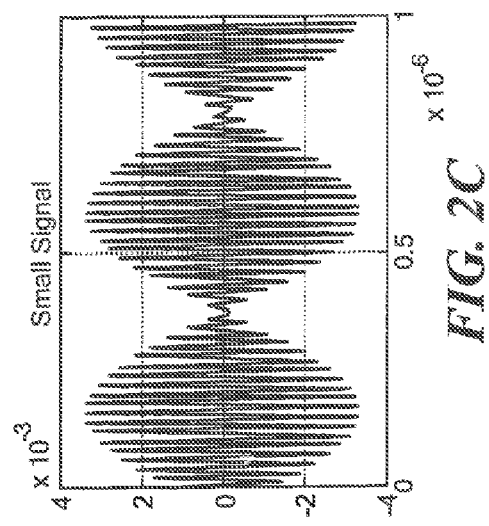
FIG. 2C shows a signal of interest.
Figure 3A:
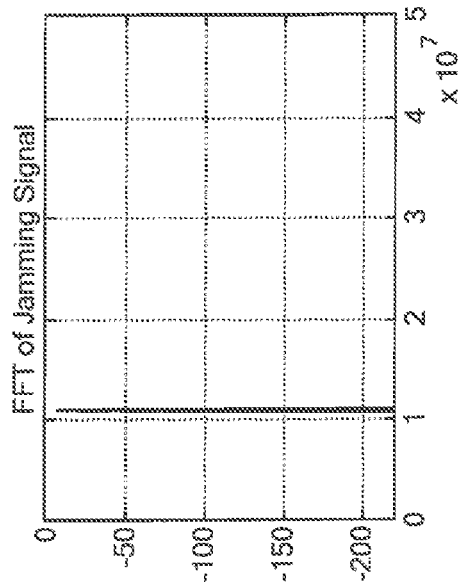
FIGS. 3A-D show the signals of FIGS. 2A-D with added distortion and zero time offset.
Figure 3B:
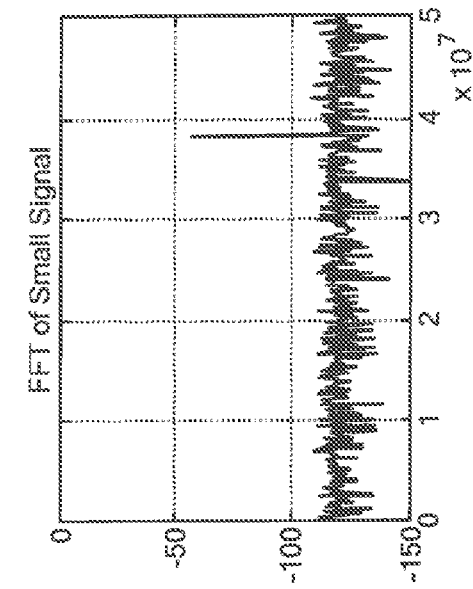
Figure 3C:
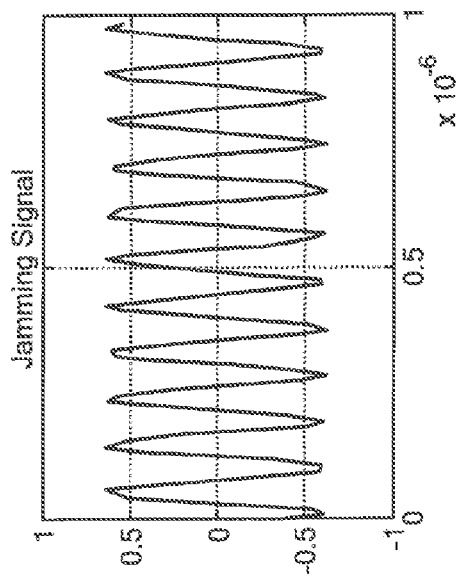
Figure 3D:
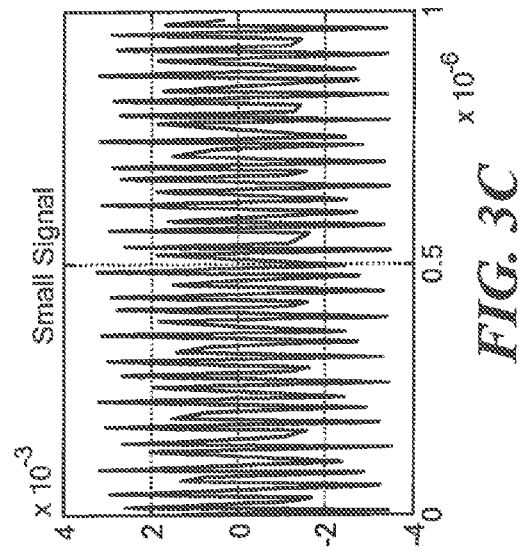

FIG. 2A shows an illustrative interfering or jamming signal, FIG. 2B shows a FFT of the jamming signal, FIG. 2C shows a signal of interest or small signal, and FIG. 2D shows a FFT of the small signal. The illustrative signals are simulated with no distortion and zero time offset. FIGS. 3A-D show the signals of FIGS. 2A-D with distortion and zero time offset. It is understood that the amount of interference and distortion cancellation is dependent upon the inverse non-linear models (130, 132 FIG. 1).

Figure 4A:
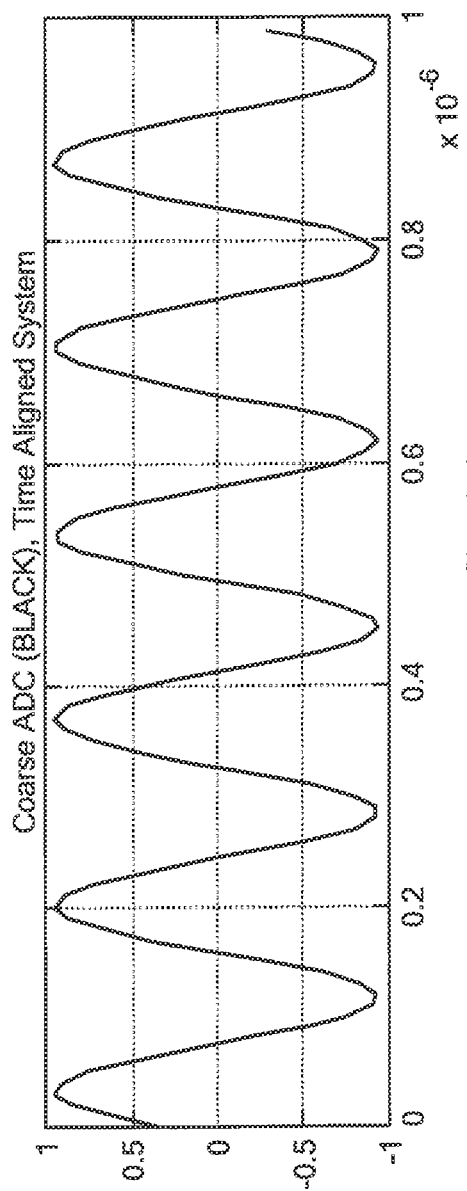
FIG. 4A shows a coarse cancellation signal.
Figure 4B:
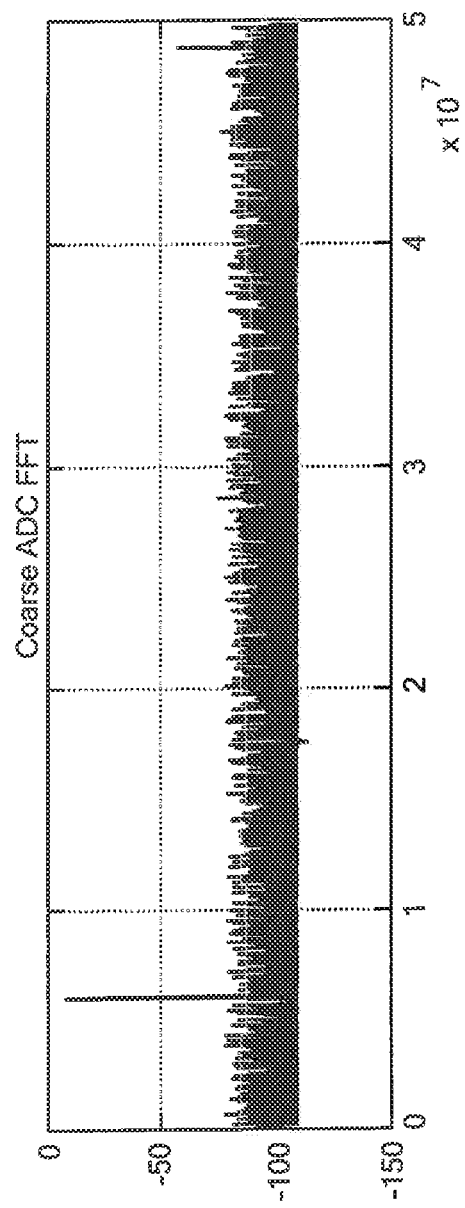
FIG. 4B shows a FFT of the coarse cancellation signal.
Figure 4C:
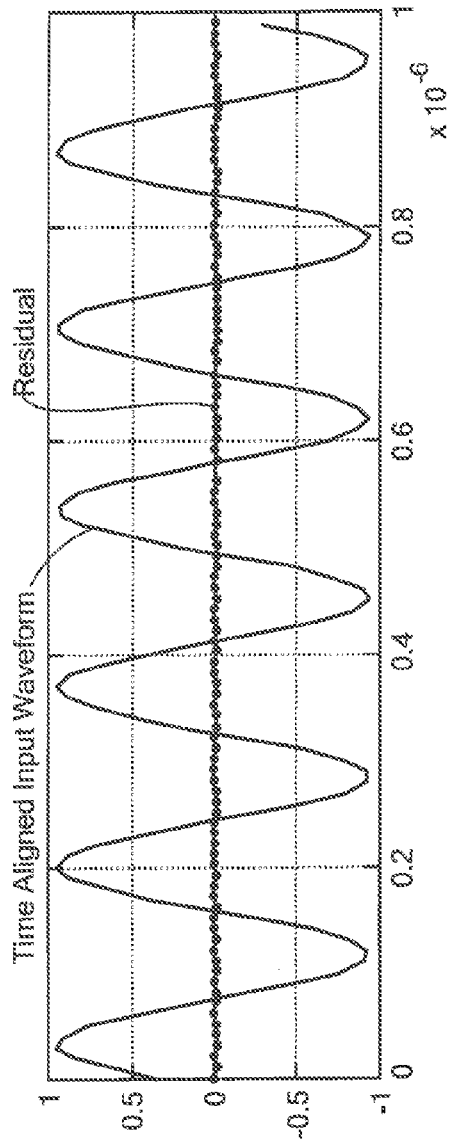
FIG. 4C shows a time aligned coarse cancellation signal and a residual signal.
Figure 4D:
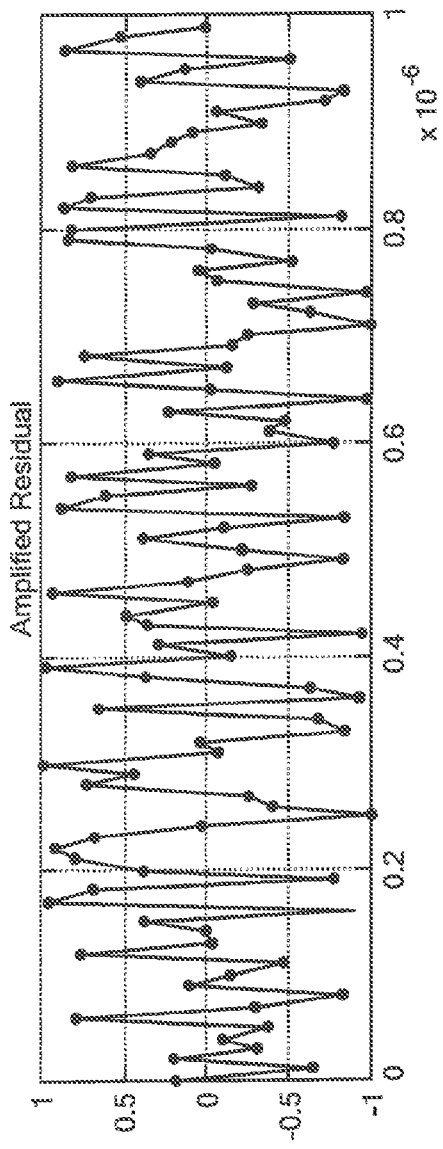
FIG. 4D shows an amplified residual signal.
Figure 4E:
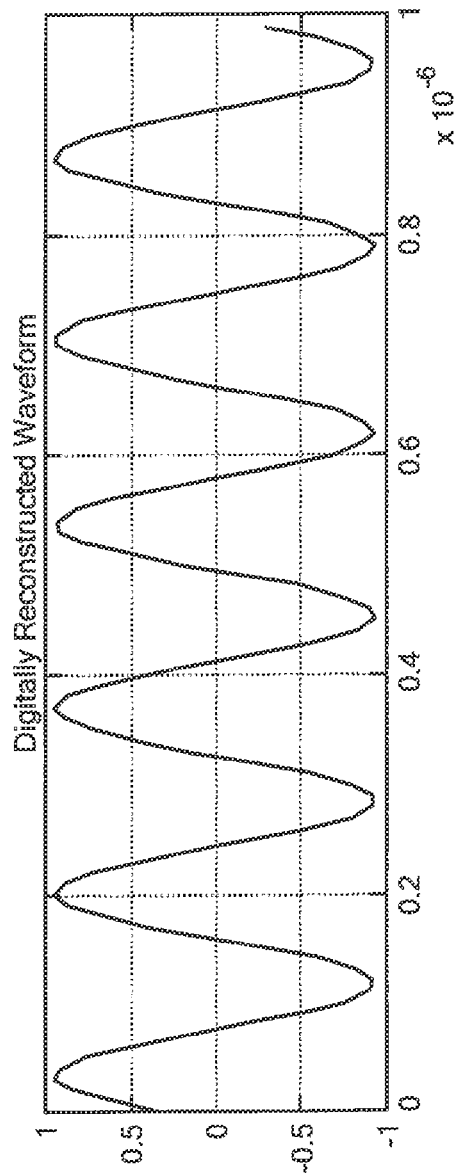
FIG. 4E shows reconstructed interfering signal.
Figure 4F:
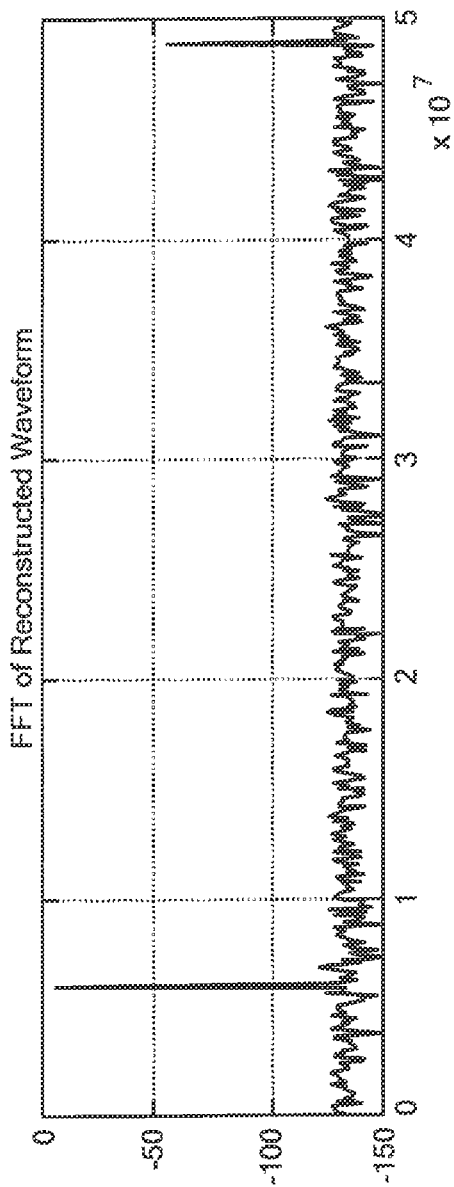
FIG. 4F shows a FFT of the reconstructed signal.
Figure 5C:
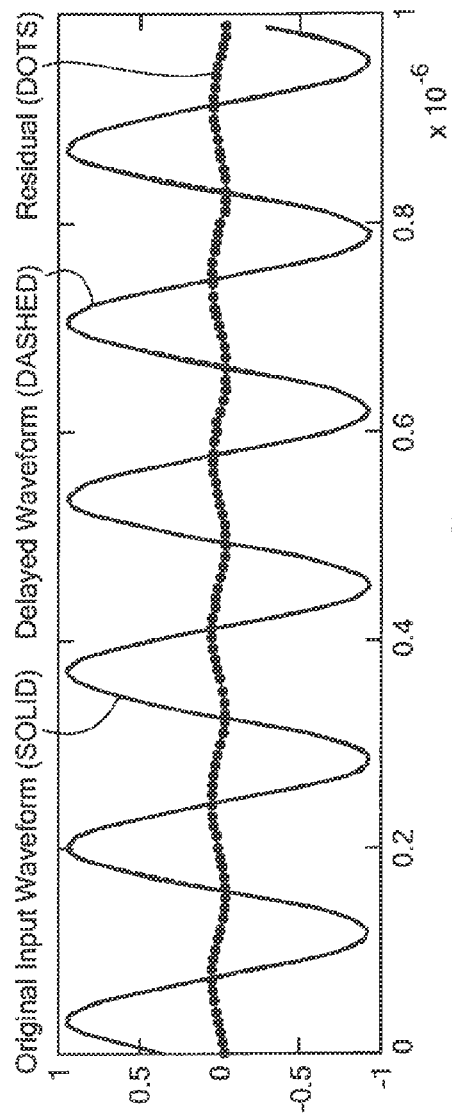
Figure 5D:
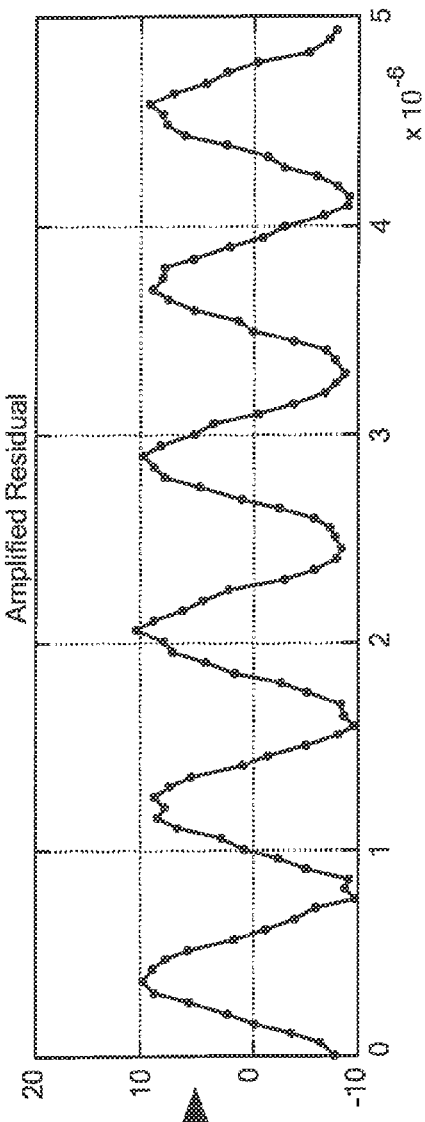

FIGS. 4A-F shows signals that are time aligned with no timing errors. FIG. 4A shows signal for the coarse ADC (108 FIG. 1) and FIG. 4B shows the FFT of the signal for the coarse ADC signal. FIG. 4C shows a time aligned input waveform of the coarse ADC and the residual signal from the summer 118 (FIG. 1) and FIG. 4D shows the amplified residual signal. FIG. 4E shows the reconstructed coarse ADC signal and FIG. 4F shows the FFT of the reconstructed coarse ADC signal.

FIGS. 5A-F show the signals of FIGS. 4A-F with a time mismatch. The growth in the amplified residual signal can be seen in FIG. 5D when a small time mismatch is introduced.

Figure 6:
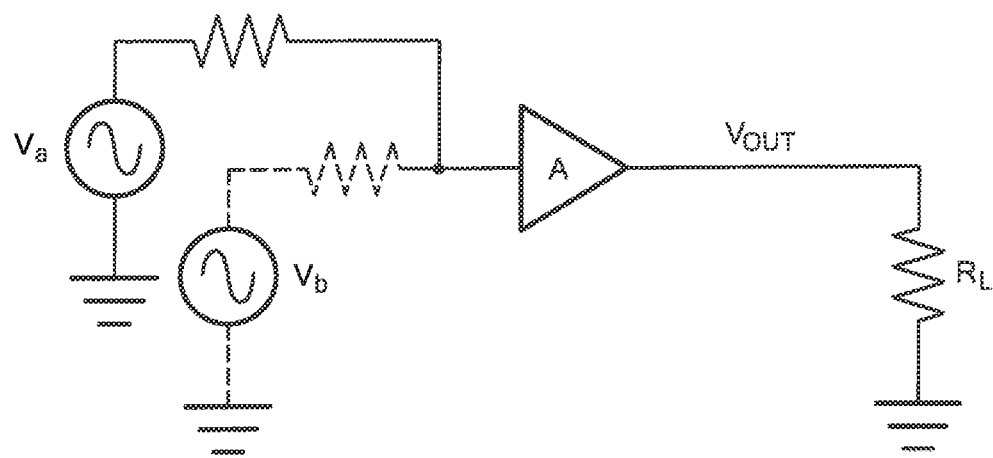
FIG. 6 is a schematic representation of a signal distortion model.

FIG. 6 shows an exemplary circuit model for theoretical harmonic distortion (single tone) and intermodulation distortion (two-tone) to provide an inverse non-linear distortion model. For calculating harmonic distortion products, a single sine wave with amplitude Va is input to a non-linear device generating output voltage $V_{OUT}$. For calculating intermodulation distortion products, sine wave signals Va and Vb (two-tone) are input to a non-linear device that generates output voltage $V_{OUT}$. First, second, and third order products are determined with a third order polynomial with the sine wave inputs as follows:

For a single tone:

$$Vin = V_a \cos(\omega_1 t)$$

$$Vout = A_o(Vin) + B_o(Vin)^2 + C_0(Vin)^3$$

Expanding Vout using Vin yields the following terms:
First Order: $A_o V_a \cos(\omega_1 t)$ Second Order: $\frac{B_o}{2}(V_a^2) + \frac{B_o}{2}(V_a^2 \cos(2 \times \omega_1 t))$ Third Order: $(\tfrac{3}{4}C_o V_a^3)\cos(\omega_1 t) + (\tfrac{1}{4}C_o V_a^3)\cos(3 \times \omega_1 t)$ For two tones:

$$Vin = V_a \cos(\omega_1 t) + V_b \cos(\omega_2 t)$$

$$Vout = A_o(Vin) + B_o(Vin)^2 + C_0(Vin)^3$$

Expending Vout using Vin yields the following terms:
First Order: $A_o V_a \cos(\omega_1 t) + A_o V_b \cos((\omega_2 t)$ Second Order: $\frac{B_o}{2}(V_a^2 + V_b^2) +$ $\frac{B_o}{2}(V_a^2 \cos(2 \times \omega_1 t)) + \frac{B_o}{2}(V_b^2 \cos(2 \times \omega_2 t)) +$ $B_o V_a V_b \cos(\omega_1 t + \omega_2 t) + B_o V_a V_b \cos(\omega_1 t - \omega_2 t)$ Third Order: $\left(\frac{3}{4}C_o V_a^3 + \frac{3}{2}C_o V_a V_b^2\right)\cos(\omega_1 t) +$ $\left(\frac{3}{4}C_o V_b^3 + \frac{3}{2}C_o V_a^2 V_b\right)\cos(\omega_2 t) +$ $\left(\frac{1}{4}C_o V_a^3\right)\cos(3 \times \omega_1 t) + \left(\frac{1}{4}C_o V_b^3\right)\cos(3 \times \omega_2 t) +$ $\left(\frac{3}{4}C_o V_a^2 V_b\right)[\cos(2 \times \omega_1 t + \omega_2 t) + \cos(2 \times \omega_1 t - \omega_2 t)] +$ $\left(\frac{3}{4}C_o V_a V_b^2\right)[\cos(2 \times \omega_2 t + \omega_1 t) + \cos(2 \times \omega_2 t - \omega_1 t)]$ Comparing products generated by a single tone input to a two-tone input, the DC term increases by $$\frac{B_o}{2}(V_b^2)$$

and fundamental frequency term increases by $\tfrac{3}{2}(C_o V a V^2)$ due to second input through a non-linear device. These small increases must be accounted for to achieve a high level of inverse non-linear distortion compensation.

Figure 6B:
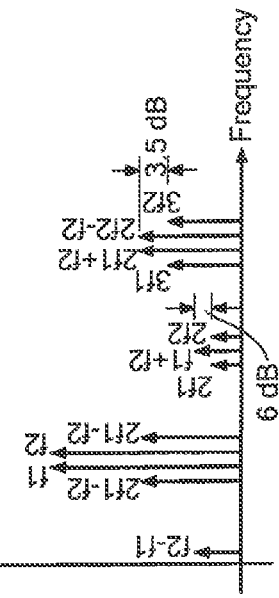

FIGS. 6A and 6B show a numerical example comparison of theoretical harmonic and intermodulation distortion levels for single and two-tone inputs. Differences are observed for the DC as a result of the 2nd order product (−56.02 dBm versus −50.00 dBm), and difference for the f1 tone as a result of the $3^{rd}$ order product (−60.46 dBm versus −50.92 dBm).

Figure 7:
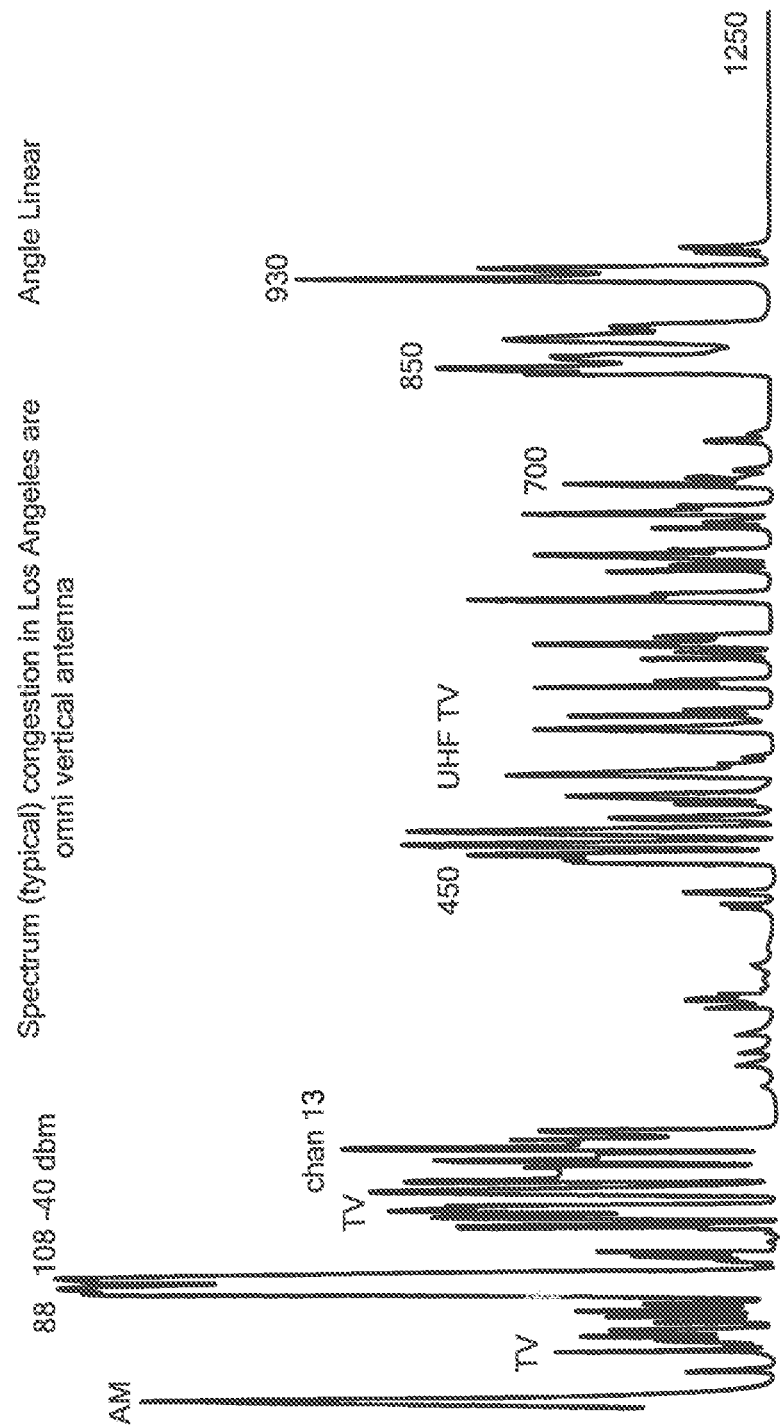
FIG. 7 is a graphical representation of spectrum congestion in the Los Angeles area.

FIG. 7 shows an exemplary RF spectrum in which a wide band digital receiver having a high dynamic range receiver to capture strong and weak signals is desirable. The strong signals produce distortion products that interfere with the reception of relatively small signals of interest. It is understood that embodiments of the invention are applicable to any system in which improving the dynamic range of a digital receiver is desirable, such as radars, satellites, radio and television, wireless, and other systems receiving data.

Figure 8:
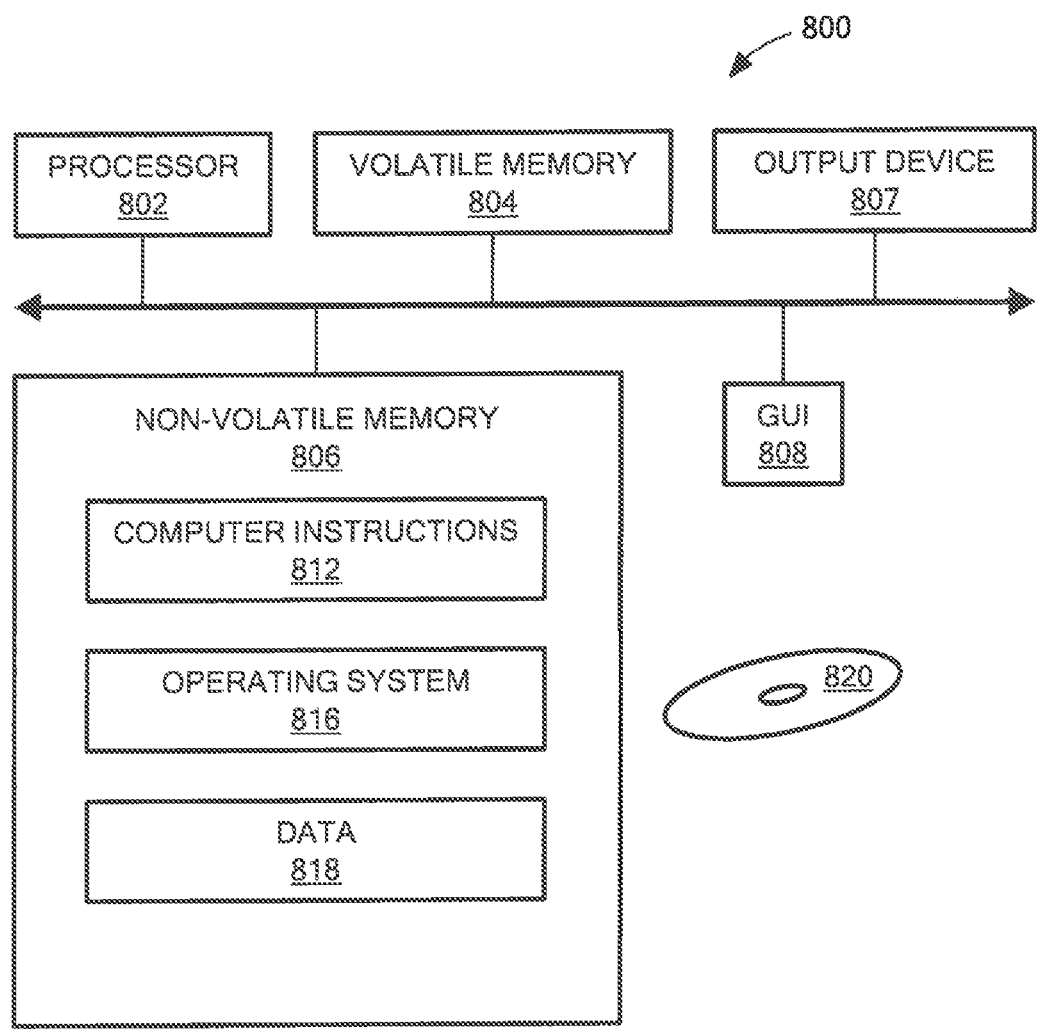
FIG. 8 is a schematic representation of an exemplary computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to the disclosed embodiments but rather should be limited only by the spirit and scope of the appended claims. All publications and references cited herein are expressly incorporated herein by reference in their entirety.

What is claimed is:

1. A system, comprising:
   a first ADC to receive an input signal comprising an interfering signal and a signal of interest;
   a DAC to receive an output from the first ADC and generate a coarse interferer cancelling signal;
   a first time delay module to delay in time the input signal;
   a first summer to subtract an output of the DAC from the delayed input signal output from the first time delay module;
   an amplifier coupled to the output of the first summer for outputting a residual signal;
   a second ADC to receive the residual signal from the amplifier,
   a second time delay module coupled to an output of the first ADC;
   a first pass distortion module coupled to the output of the second time delay module;
   a second pass distortion module coupled to the output of the second ADC;
   a second summer module to receive an output of the first pass distortion module and an output of the second pass distortion module and output a reconstructed signal of interest.

2. The system according to claim 1, further including a gain module between the second ADC and the second pass distortion module.

3. The system according to claim 1, wherein the first and second pass distortion models provide non-linear harmonic distortion calibration.

4. The system according to claim 1, wherein the system does not use a predicted waveform.

5. The system according to claim 1, wherein the system does not subtract a known waveform to perform interference cancellation.

6. The system according to claim 1, wherein a time mismatch between the first and second time delay modules does not result in growth in the amplified residual signal.

7. The system according to claim 1, wherein the first pass distortion module is configured to apply an inverse non-linear distortion module to remove distortion products on data received by the first ADC.

8. The system according to claim 7, wherein the first pass distortion module is configured to apply an inverse polynomial based on a model of the first ADC.

9. The system according to claim 1, wherein the second pass distortion module is configured to apply an inverse non-linear distortion function for the second ADC and a DGC.

10. A method, comprising:
    receiving an input signal comprising an interfering signal and a signal of interest;
    digitizing the input signal to generate a digitized input signal and a coarse interferer cancelling signal;
    employing a first time delay module to delay in time the input signal;
    subtracting the coarse interferer cancelling signal from the delayed input signal to generate a residual signal;
    amplifying the residual signal;
    digitizing the amplified residual signal;
    delaying the digitized input signal;
    employing a first pass distortion module to remove distortion from the delayed digitized input signal;
    employing a second pass distortion module to remove distortion from the digitized amplified residual signal;
    summing in a summer the outputs of the first and second pass distortion modules; and
    reconstructing the signal of interest from the summer output.

11. The method according to claim 10, further including employing a gain module between the second ADC and the second pass distortion module.

12. The method according to claim 10, wherein the first and second pass distortion models provide non-linear harmonic distortion calibration.

13. The method according to claim 10, wherein a predicted waveform is not used.

14. The method according to claim 10, wherein a known waveform is not subtracted to perform interference cancellation.

15. The method according to claim 10, wherein a time mismatch between the first and second time delay modules does not result in growth in the amplified residual signal.

16. The method according to claim 10, further including configuring the first pass distortion module for determining a strong signal and its fundamental distortion products, determining a distortion function, generating a distorted waveform based on the distortion function, and removing/subtracting the undesired distortion products.

17. The method according to claim 10, further including configuring the first pass distortion module for applying an inverse polynomial equation based on a model of the first ADC and observed distortion products.

18. The method according to claim 10, further including configuring the second pass distortion module for applying an inverse non-linear distortion function on analog signal fed through the second ADC and a DGC block.

19. A system, comprising:
    a first ADC means for receiving an input signal comprising an interfering signal and a signal of interest;
    a DAC means for receiving an output from the first ADC and generating a coarse interferer cancelling signal;
    a first time delay means delaying in time the input signal;
    a first summer means for subtracting an output of the DAC from the delayed input signal output from the first time delay means;
    an amplifier coupled to the output of the first summer means for outputting a residual signal;
    a second ADC means receiving the residual signal from the amplifier;
    a second time delay means coupled to an output of the first ADC means;
    a first pass distortion means coupled to the output of the second time delay module;
    a second pass distortion means coupled to the output of the second ADC means;

a second summer means for receiving an output of the first pass distortion module and an output of the second pass distortion means and output a reconstructed signal of interest.

* * * * *